United States Patent [19]
Duret

[11] Patent Number: 5,455,511
[45] Date of Patent: Oct. 3, 1995

[54] DIGITAL DIRECTIONAL RESONANCE MAGNETOMETER

[75] Inventor: Denis Duret, Grenoble, France

[73] Assignee: Commissariat a l'Energie Atomique, Paris, France

[21] Appl. No.: 202,590

[22] Filed: Feb. 28, 1994

[30] Foreign Application Priority Data

Mar. 16, 1993 [FR] France .................................. 93 03008

[51] Int. Cl.$^6$ ............................... G01V 3/00; G01V 3/02; G01V 3/14
[52] U.S. Cl. .......................... 324/301; 324/300; 324/302
[58] Field of Search ................................... 324/300, 301, 324/302, 303, 304

[56] References Cited

U.S. PATENT DOCUMENTS

| | | | |
|---|---|---|---|
| 3,482,158 | 12/1969 | Winterhoff | 324/301 |
| 4,791,368 | 12/1988 | Tsuzuki | 324/301 |
| 5,187,438 | 2/1993 | Alcouffe et al. | |
| 5,221,897 | 6/1993 | Duret et al. | |
| 5,296,802 | 3/1994 | Beranger et al. | |

FOREIGN PATENT DOCUMENTS

| | | |
|---|---|---|
| 0240221 | 10/1987 | European Pat. Off. |
| 0463919 | 1/1992 | European Pat. Off. |
| 0522191 | 1/1993 | European Pat. Off. |

OTHER PUBLICATIONS

Journal of Physics E/Scientific Instruments, 1987, Jun. 20, 1987, Part 1, No. 6, J. K. Hulbert, "A Field Tracking Digital NMR Magnetometer for In Situ Use with Superconducting Solenoids", pp. 283–287.

Instruments and Experimental Techniques, vol. 22, No. 2, Mar. 1, 1979, pp. 504–508, E. V. Dvornikov, "Large–Scale Automation of a Nuclear Magnetic Resonance Magnetometer".

Journal of Physics E. Scientific Instruments, vol. 12, No. 7, Jul. 1979, J. Kubiak, et al., "A New Field–Tracking NMR Magnetometer System", pp. 640–643.

Instruments and Experimental Techniques, vol. 24, Nov. 1981, No. 6, Part 2, A. E. Pryakhin, "Tracking Nuclear Magnetic Resonance Magnetometer with Digital Readout in Gauss", pp. 1467–1472.

A field tracking digital NMR magnetometer for in situ use with superconducting solenoids (J. K. Hulbert).

Primary Examiner—Sandra L. O'Shea
Assistant Examiner—Mack Haynes
Attorney, Agent, or Firm—Oblon, Spivak, McClelland, Maier, & Neustadt

[57] ABSTRACT

The magnetometer according to the invention comprises a logic unit (50) receiving a resonance detection signal, a digital processor (60) supplying a number N, a digital-analog converter converting said number into current for establishing a feedback. The measurement of the field is directly digitally given by the processor.

Use in magnetometry.

14 Claims, 12 Drawing Sheets

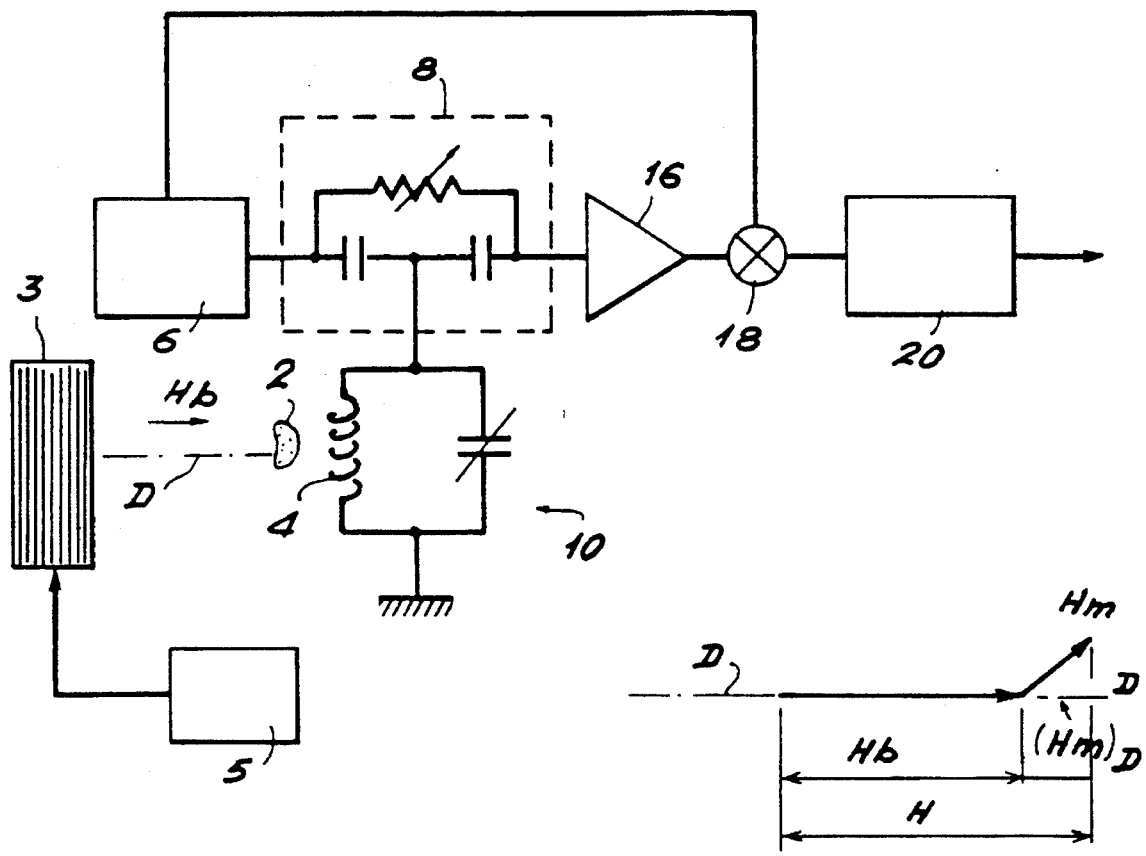
FIG. 1
FIG. 2
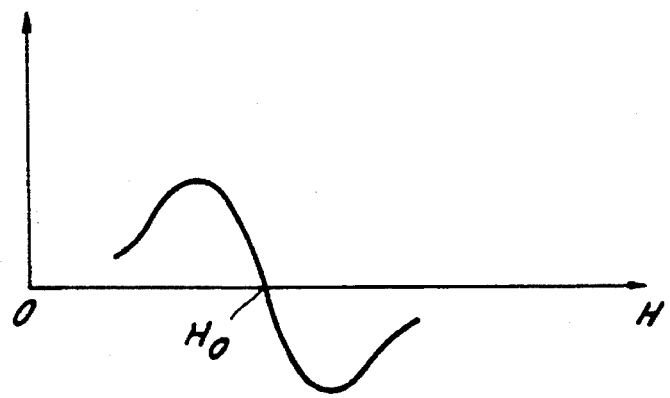
FIG. 3

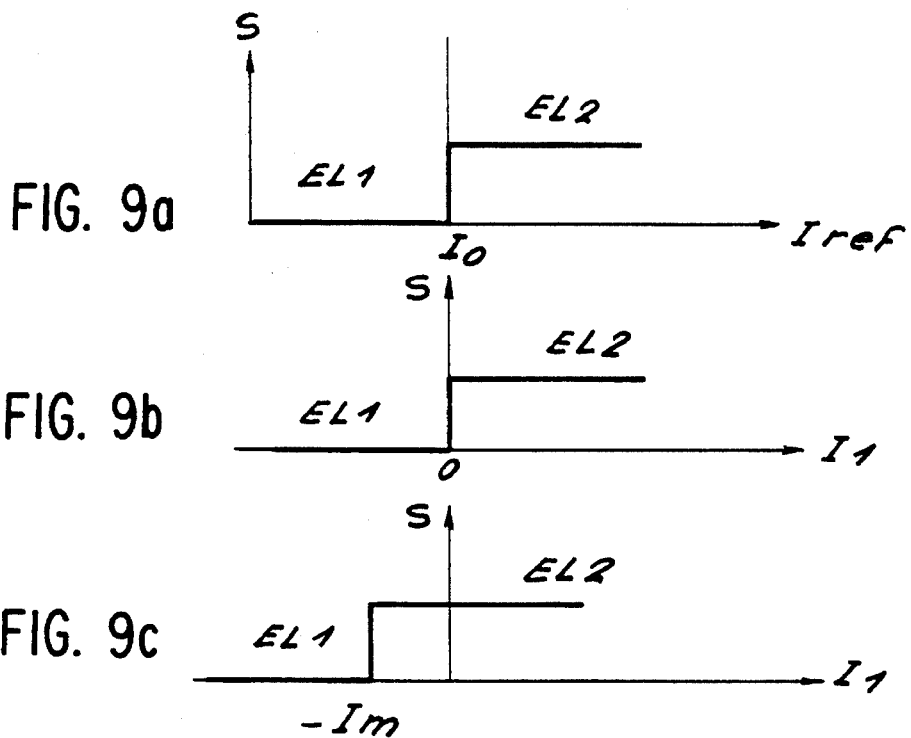
FIG. 9a
FIG. 9b
FIG. 9c
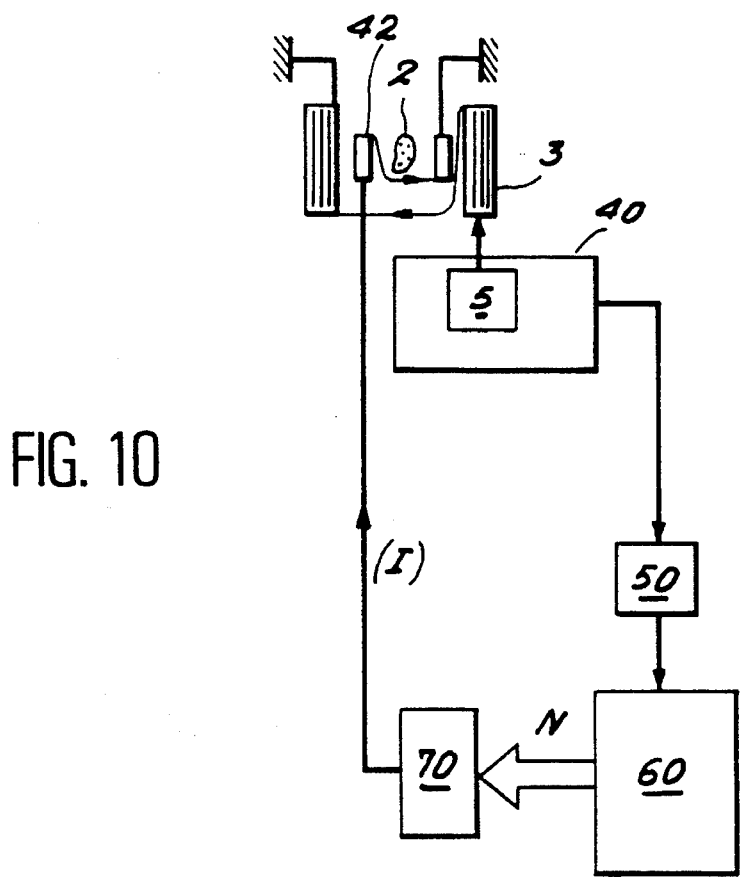
FIG. 10

DIGITAL DIRECTIONAL RESONANCE MAGNETOMETER

TECHNICAL FIELD

The present invention relates to a digital directional resonance magnetometer. It is used in the measurement of weak magnetic fields, e.g. a few dozen microteslas.

The invention has applications in geophysics, mining prospecting, space detection, etc.

PRIOR ART

The magnetometer according to the invention is of the directional resonance type. These apparatuses are well known and are e.g. described in French patent application FR-A-2 663 751 filed by the present applicant (said application containing bibliographical references on the subject) or in the corresponding European patent application EP-A-463 919, or in the article by D. DURET, M. MOUSSAVI and M. BERANGER entitled "Use of High Performance Electron Spin Resonance Materials for the Design of Scalar and Vectorial Magnetometers", published in IEEE Transactions on Magnetics, vol. 27, no. 6, November 1991, pp. 5405–5407.

The structure and operation of these apparatuses will briefly be described in certain of their variants with reference to the attached FIGS. 1 to 6.

Firstly, in FIG. 1, it is possible to see a sample 2 containing a material having electron or nuclear spins, a first winding 3 producing a magnetic polarization field Hb directed in direction D, a second winding 4 in the vicinity of the sample 2, a current generator 5 having a regulatable intensity supplying the first winding 3, a high frequency generator 6 connected to a measuring bridge 8, which is in turn connected to a resonant circuit 10 containing the winding 4, a low noise amplifier 16 connected to the measuring bridge 8, a balance mixer 18 receiving on the one hand the voltage supplied by the amplifier 16 and on the other a reference voltage from the high frequency generator 6 and finally a low pass filter 20.

The sample 2 is subject to the field to be measured Hm, as well as to the polarization field Hb. These two fields are not generally colinear. The magnetic field measured by such an apparatus is the sum of Hb and the component of Hm projected in the direction D and which is designated $(Hm)_D$, bearing in mind that Hb is much greater than Hm. These different fields or components are shown in FIG. 2. The total field in the direction D is designated H.

The apparatus functions as follows. The generator 6, connected to the circuit 10 and to its winding 4, is able to excite the resonance of the spins of the sample 2. Its frequency is very accurately fixed ($10^{-9}$ to $10^{-6}$). The resonance of the spins occurs when the frequency fo of the excitation signal is equal to the LARMOR frequency, conventionally determined by the relation $(1/(2\pi))\gamma Ho$, in which $\gamma$ is the gyromagnetic ratio of the sample used (in the case of the electron $\gamma=2\pi \cdot 28$ GHz/T) and Ho is the value at resonance of the total magnetic field applied.

At the same time the circuit 10 and its winding 4 are able to detect this resonance, the function of the circuit 8 being to separate the excitation and the detection.

The apparatus shown in FIG. 1 detects the passage through the resonance when, the frequency fo being fixed, the total field H passes through the value Ho. Thus, FIG. 3 shows the variations of the voltage V1 supplied by the low pass filter 20 when the field H varies and passes through Ho. This curve is of the dispersion type, i.e. antisymmetrical, with a positive part, a cancelling out (for the value Ho corresponding to resonance) and a negative part. The knowledge of Ho makes it possible to rise to $(Hm)_D$ if Hb is known.

The apparatus of FIG. 4 is a variant where use is also made of an oscillator 22 and a winding 24 for producing a magnetic field having an audio frequency fm, said field, known as the dither field being superimposed on the polarization field Hb.

Moreover, in the variant of FIG. 4 and at the output of the balanced mixer 18, the low pass filter 20 of FIG. 1 is replaced by a band pass filter 26 centred around the frequency fm. A phase shifter 28 receives the high frequency signal from the generator 6 and supplies a signal of appropriate phase to the balanced mixer 18.

A circuit 30 for synchronous detection at the frequency fm receives on one of its inputs a reference signal from the generator 22. This reference signal has a frequency fm, but its amplitude and phase can be made different from those of the signal supplied by the oscillator 22 to the coil 24. The circuit 30 has another input connected to the output of the filter 26 and finally supplies a voltage Vs.

By fitting at the output of the synchronous detection means 30 an appropriate, not shown, observation means, it is possible to observe the curve of the variations of Vs as a function of the total field H. This curve is shown in FIG. 5. Like that of FIG. 3, it is an antisymmetrical curve with a cancelling out for the value Ho of the field corresponding to the resonance of the spins.

With such apparatuses, a variation of the field to be measured Hm, if it is well below the width of the lines shown in FIGS. 3 and 5, leads to a variation compared with the resonance value and by the appearance of a non-zero voltage (V1 or Vs) at the magnetometer output. This voltage varies substantially linearly as a function of the variation at Ho.

The linearity can be improved by a field feedback obtained by using the voltage V1 (FIG. 3) or the voltage Vs (FIG. 5) as the error signal, by integrating said voltage and by injecting into a feedback coil a current proportional to the integrated voltage. The axis of this feedback coil must be parallel to the direction D of the polarization field.

This can be seen in the diagram of FIG. 6 where, in addition to the means already shown in FIG. 4, there are an integrator 31 and a feedback winding 32. In such an apparatus, the total field is still maintained at the value corresponding to resonance and the integrated error signal constitutes the measurement signal, which appears on the apparatus output 34.

In other words, no matter what the field applied from the outside to the sample, along the direction D the said sample sees the same field, namely that ensuring the resonance of the spins. As the field corresponding to resonance is much larger (more than ten times) than the field having an external origin to be measured, the geometric sum modulus (cf. FIG. 2) is substantially equal to the sum of the field created by the polarization current and directed in accordance with direction D and the projection on said direction of the external field to be measured. In other words, the means 31 and 32 make the apparatus dependent on the resonance, no matter what the field applied from the outside.

In the embodiment illustrated in FIG. 6, it should be also be noted that there are three windings, respectively polarization 3, dither 24 and feedback 32, which are assumed to be separate. However, as they all have the same axis, they can be combined into one and the same winding.

The integrator 31 can either directly supply the feedback current, or can supply a voltage, in which case it is necessary to associate a voltage-current converter with it, e.g. in the form of a resistor.

Thus, according to this prior art, known directional resonance magnetometers generally have a sample with spins subject to the field to be measured, means for applying to said sample a magnetic polarization field, means for applying to the sample a radiofrequency field and for exciting the resonance of the spins, means for detecting said resonance, means for producing an anti-symmetrical electrical signal which is cancelled out when the total field applied to the sample assumes the value Ho corresponding to the resonance of the spins and which is positive or negative as a function of whether the total field applied is higher or lower than said particular value (Ho). In the absence of a field to be measured, the apparatus is regulated so that it is at resonance. In the presence of a field to be measured, the feedback field reestablishes the resonance and the value of the integrated error signal (or the feedback current) constitutes the measurement of the magnetic field.

Although satisfactory in certain respects, these magnetometers still suffer from disadvantages. In particular they are of an analog nature, so that if a digital measurement is required, it is necessary to associate therewith an analog-digital converter. However, in the present state of these components, it would appear that the precision of these converters is not appropriate for the very great precision required for certain magnetometers. Thus, it is e.g. a question of measuring the geomagnetic field, whose value is approximately 50 microteslas and the tolerated error is 10 picoteslas, which imposes a resolution of 0.2 per mille. Such a precision corresponds to a 22 bit analog-digital converter, which does not exist in the state of the art.

DESCRIPTION OF THE INVENTION

The present invention aims at obviating this disadvantage. To this end it proposes a magnetometer intrinsically comprising digital means, so that the signal supplied by the apparatus is not only already in digital form, but corresponds to a precision adapted to the high performance characteristics of the apparatus.

According to the invention, this result is obtained by the use of means which are at least partly digital in order to form the error signal and establish the feedback which will bring the magnetometer to resonance.

In the absence of a field to be measured and as in the prior art described hereinbefore, in order to obtain the resonance of the spins at the frequency fo of the excitation generator, to the sample is applied a field defined by $2\pi fo/\gamma$, which can be obtained by any appropriate means. When a field to be measured is applied to the sample, the resonance disappears. In order to obtain it again, it is necessary to establish a feedback current on the basis of the error signal obtained. According to the invention, this function is fulfilled by digital, logic means. A digital error signal is produced in the form of a number having several digits. On the basis of this number, a feedback current is formed, which, applied to one of the windings which is conventionally provided, makes it possible to reestablish resonance. The passage through resonance is detected by a logic unit, which blocks the number at its corresponding value, this then representing the field to be measured. Thus, it is possible to directly obtain the value of the magnetic field in digital form.

According to the invention, the polarization field Ho is produced either by polarization means (in this case it is superimposed on the feedback field, when it exists) or by feedback means, which then produce a field corresponding to the sum of Ho and the feedback field.

BRIEF DESCRIPTION FO THE DRAWINGS

FIG. 1 shows a variant of a prior art directional resonance magnetometer.

FIG. 2 shows the composition of the different fields present.

FIG. 3 illustrates a dispersion curve around resonance.

FIG. 9 is an explanatory diagram of the apparatus of FIG. 8.

FIG. 10 illustrates a second embodiment of a specific feedback winding magnetometer.

DETAILED DESCRIPTION OF THE EMBODIMENTS

Figure 7:
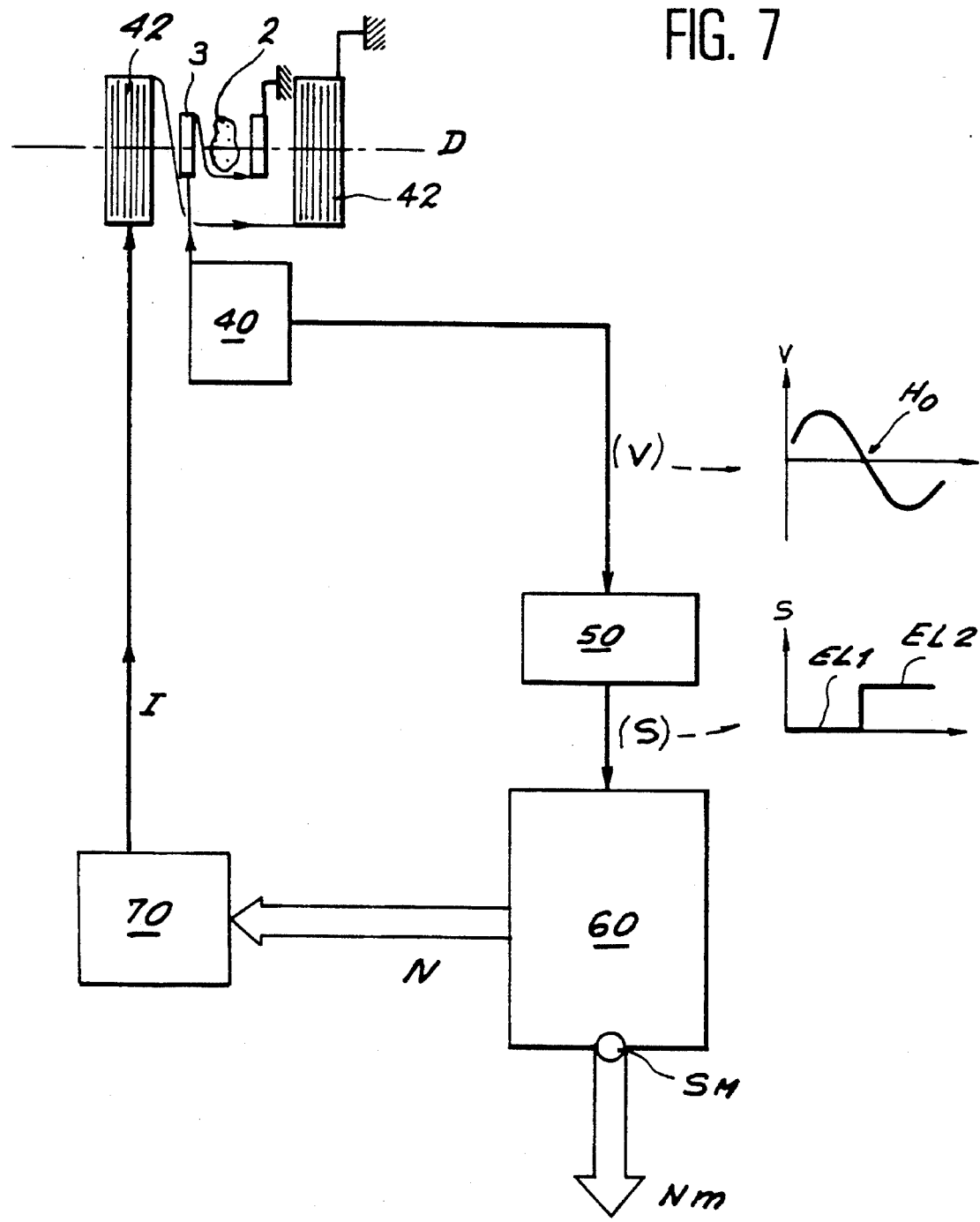
FIG. 7 is a general diagram of a magnetometer according to the invention.

FIG. 7 is a general diagram of a magnetometer according to the invention. The means already used in the prior art are symbolized by a block 40.

Figure 4:
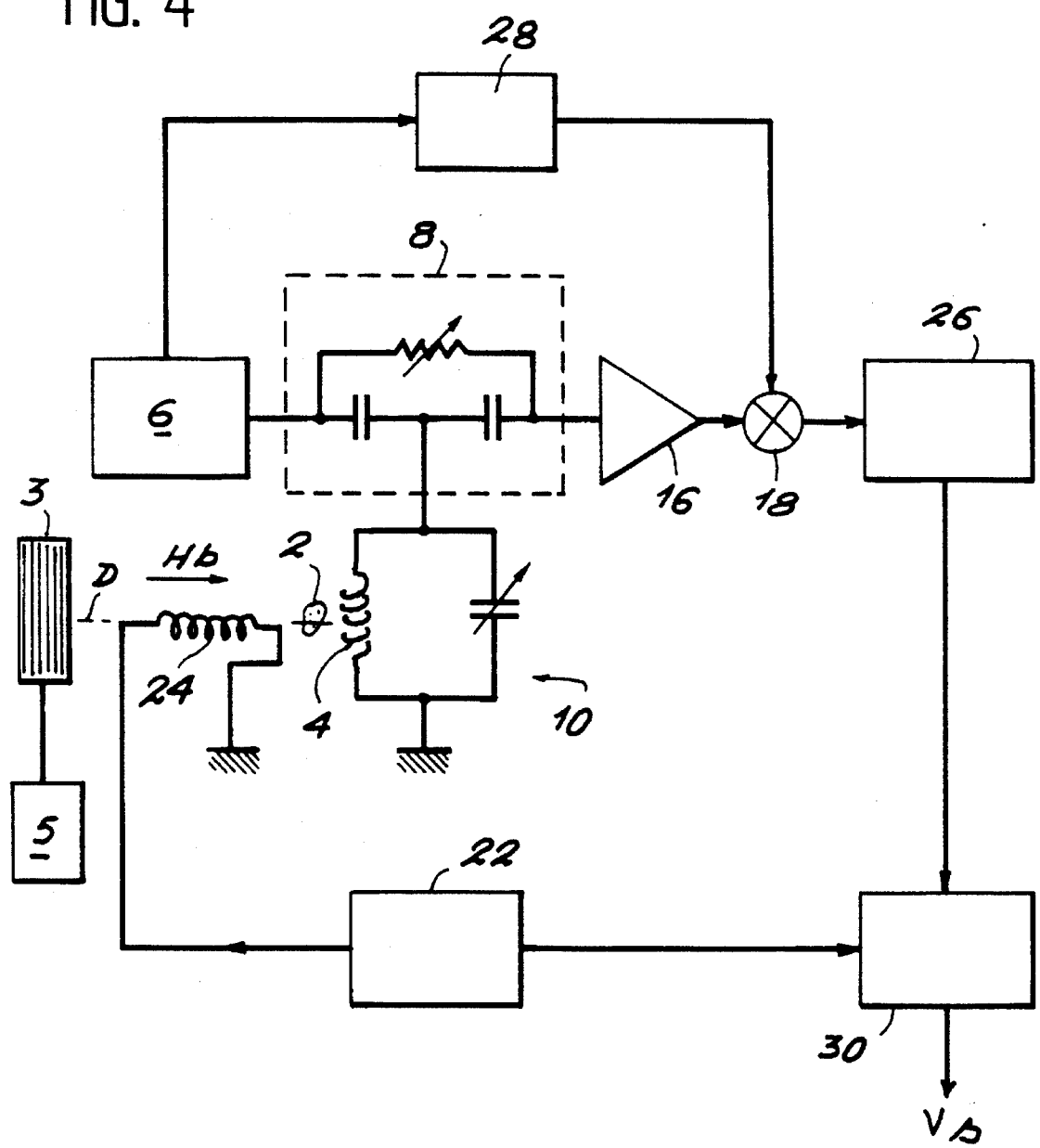
FIG. 4 shows another prior art, dither field magnetometer variant.
Figure 6:
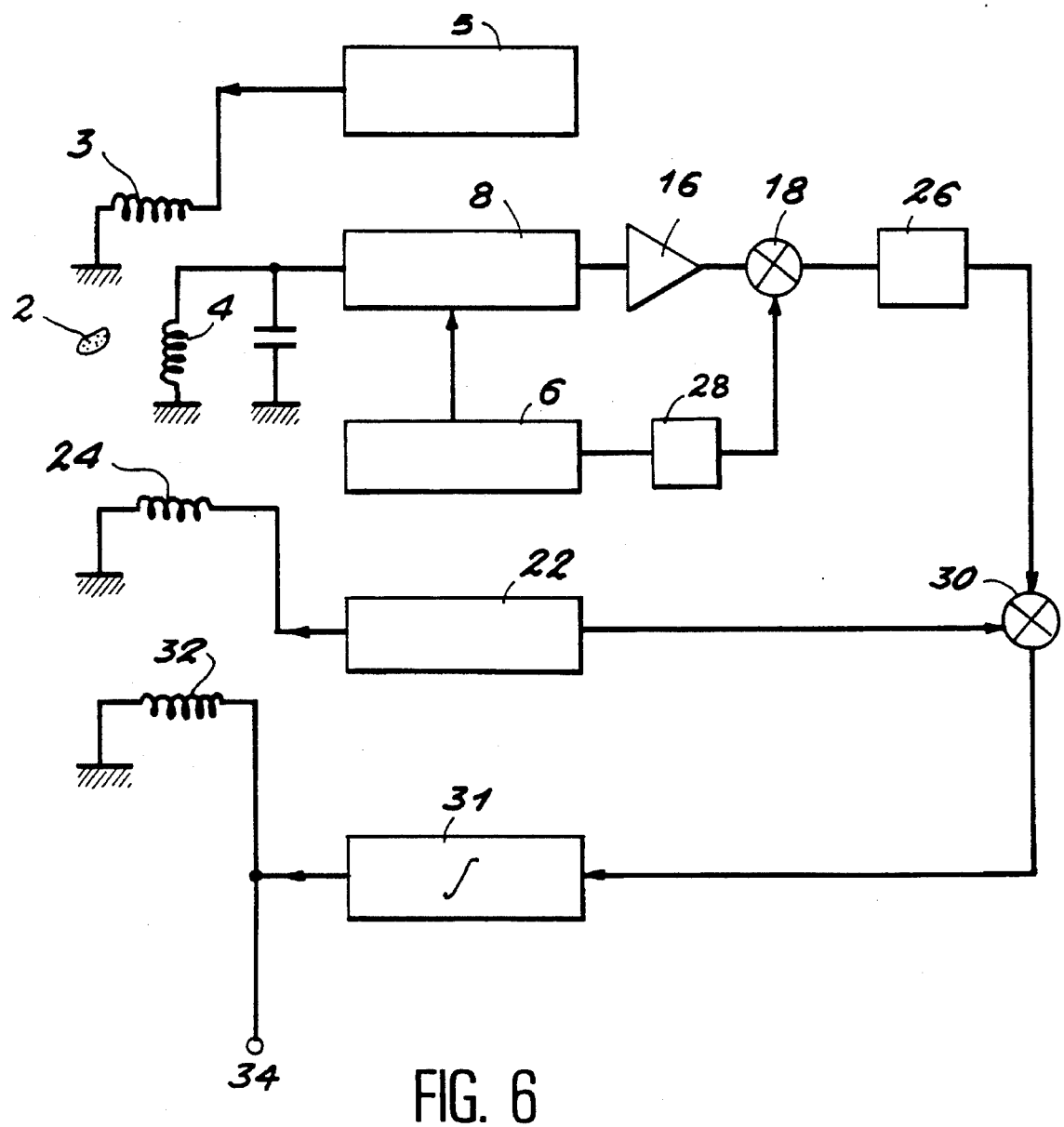
FIG. 6 shows yet another prior art, dither field and feedback field magnetometer variant.

It must be understood that these are means which have already been described relative to FIGS. 1, 4 and 6, taken singly or in combination, and which make it possible to excite the resonance, detect it and supply a signal V which is cancelled out when the total magnetic field assumes the value Ho corresponding to the resonance. The magnetometer according to the invention is characterized by a logic circuit 50, which receives the signal in question and supplies a logic signal S able to assume two logic states EL1, EL2, the second indicating that the signal V has been cancelled out, i.e. there has been a passage to resonance.

The magnetometer according to the invention also comprises a processor or controller 60, which receives the logic signal S and supplies a digital signal N, in other words a number having several bits, e.g. 8, 16 or more bits. This processor 60 also supplies, to a measuring output SM, a number which has the stored value finally assumed by the number N when resonance has taken place.

The magnetometer according to the invention also comprises a digital-analog converter 70, which receives the number N and transforms it into current I (either directly, or by means of a voltage, which is then itself converted into current). The current I supplies a winding 42 positioned in the vicinity of the sample 2. It must be understood that this winding 42 can either be a specific winding, added to the other conventionally existing windings in a magnetometer (such as those shown in FIG. 6 under references 3 and 24), or any random one of these windings, because it is a question of producing a feedback field to be directed in the general direction D common to all the windings.

The apparatus of FIG. 7 functions in the following way. When the magnetic field to be measured is zero, the polarization current is regulated in such a way that resonance occurs. Then, the voltage V is zero and the logic signal S supplied by the circuit 50 is in its second logic state EL2. The processor 60 supplies a zero number N. No feedback current I is applied to the winding 42.

When a field Hm is applied to the sample, resonance no longer occurs, the voltage V is no longer zero and instead assumes a value constituting an error signal. The logic signal S passes into its first logic state EL1. The processor 60 then increments the number N (positive or negative) by an appropriate algorithm, so that a current is applied to the winding 42. This leads to a feedback field, which modifies the total field applied to the sample 2 until the projection of Hm on direction D is exactly compensated by the feedback field. Then, the voltage V again passes through zero, the logic signal S reassumes its second logic state EL2 indicating to the processor 60 that resonance has been reestablished. The processor then blocks the number N at the value taken Nm and supplies the latter to the measurement output SM. This value Nm is the digital value of the projection of the field Hm to be measured in the direction D.

On designating by bo the value of the magnetic field obtained for a number N equal to 1 (i.e. when the least significant bit of N is 1, all the other bits then being 0), the measured field corresponding to the final value Nm is equal to Nmbo+$\epsilon$, in which $\epsilon$ is an error term below bo.

In the diagram of FIG. 7, the means for ensuring resonance by regulating the polarization field are not expressly shown and are assumed to be contained in the general means 40, which thus contains the current source making it possible to create said polarization field via the winding 3.

Figure 8:
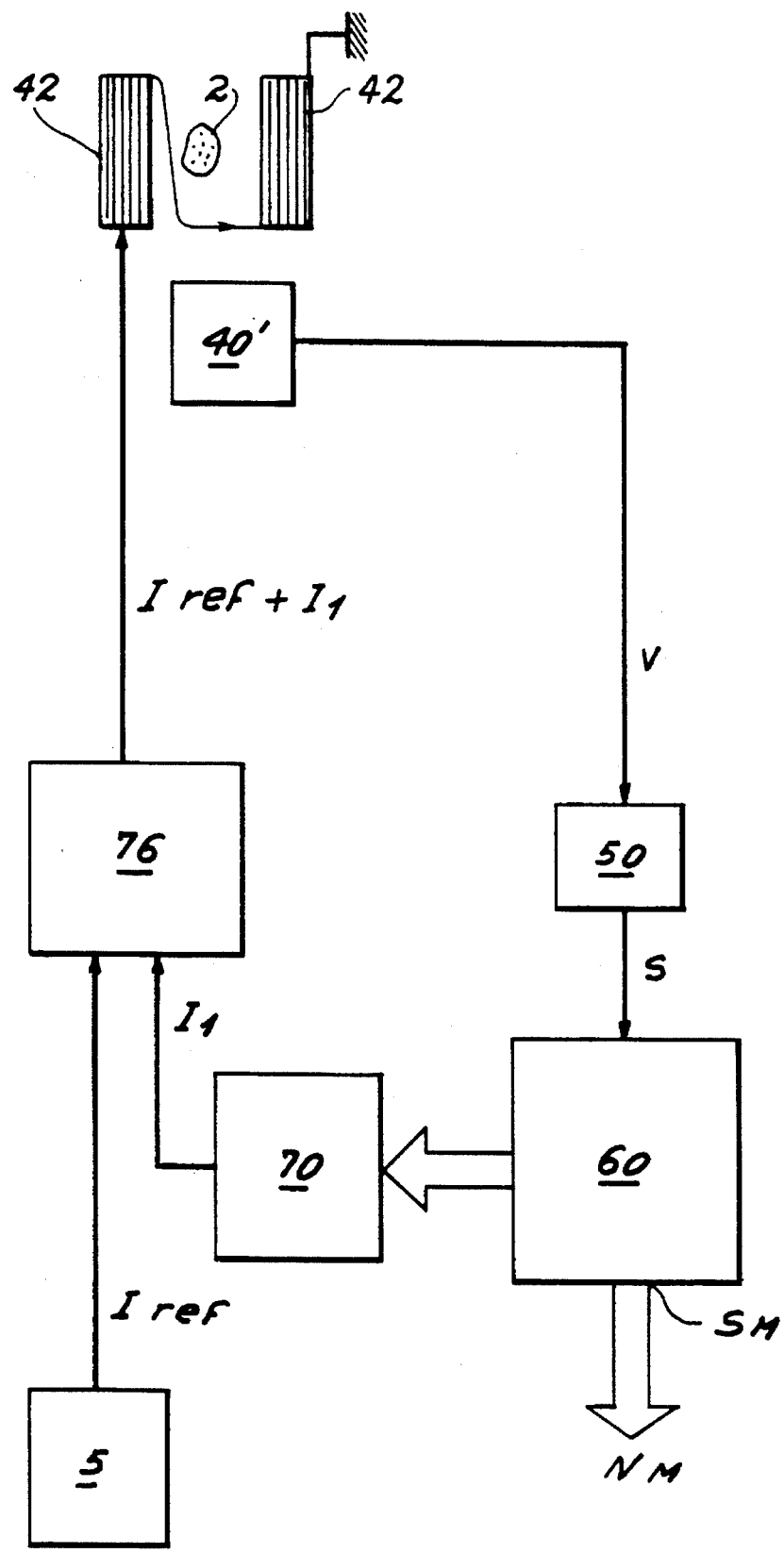
FIG. 8 illustrates a first embodiment of a current adder magnetometer.

However, in the diagram of FIG. 8, the reference current source 5 making it possible to create said field via the winding 42 is expressly shown (the general means free from said source then being given the reference 40'). The reference current Iref is regulated to a value Io. To this current is added the current I1 supplied by the converter 70 and this occurs in an adder 76, which supplies the sum Io+I1, which is applied to the winding 42.

FIG. 9 shows the variations of a few signals appearing in the apparatuses of FIGS. 7 and 8.

Firstly, in part (a), the reference current Iref supplied by the source 5 is plotted on the abscissa and the logic signal S on the ordinate. If, in the absence of a field to be measured, the current Iref is below the value Io corresponding to resonance, the signal S is in its first logic state EL1. If the current Iref clears the value Io, the signal S switches and assumes its second logic state EL2.

Still in the absence of a field to be measured, the current I1 (part b), supplied by the converter 70 is zero. In the case of a field to be measured, it is necessary to have a current I1 equal to −Im in order to again obtain resonance, i.e. in order to switch the logic signal S from state EL1 to state EL2 (part c).

The embodiment of FIG. 8 is simple, but is dependent on the stability of the source 5. The precision of the measurement is dependent on the value of bo and the capacity of the converter 70, which must correspond to the maximum value of the field Hm. An error can be introduced during the variation of bo.

In the variant illustrated in FIG. 10, the means for forming the polarization field and those for the feedback field are separate. The former are constituted by the source 5 located in the general means 40 and the winding 3, whilst the latter are constituted by the converter 70 and the specific winding 42.

Figure 11:
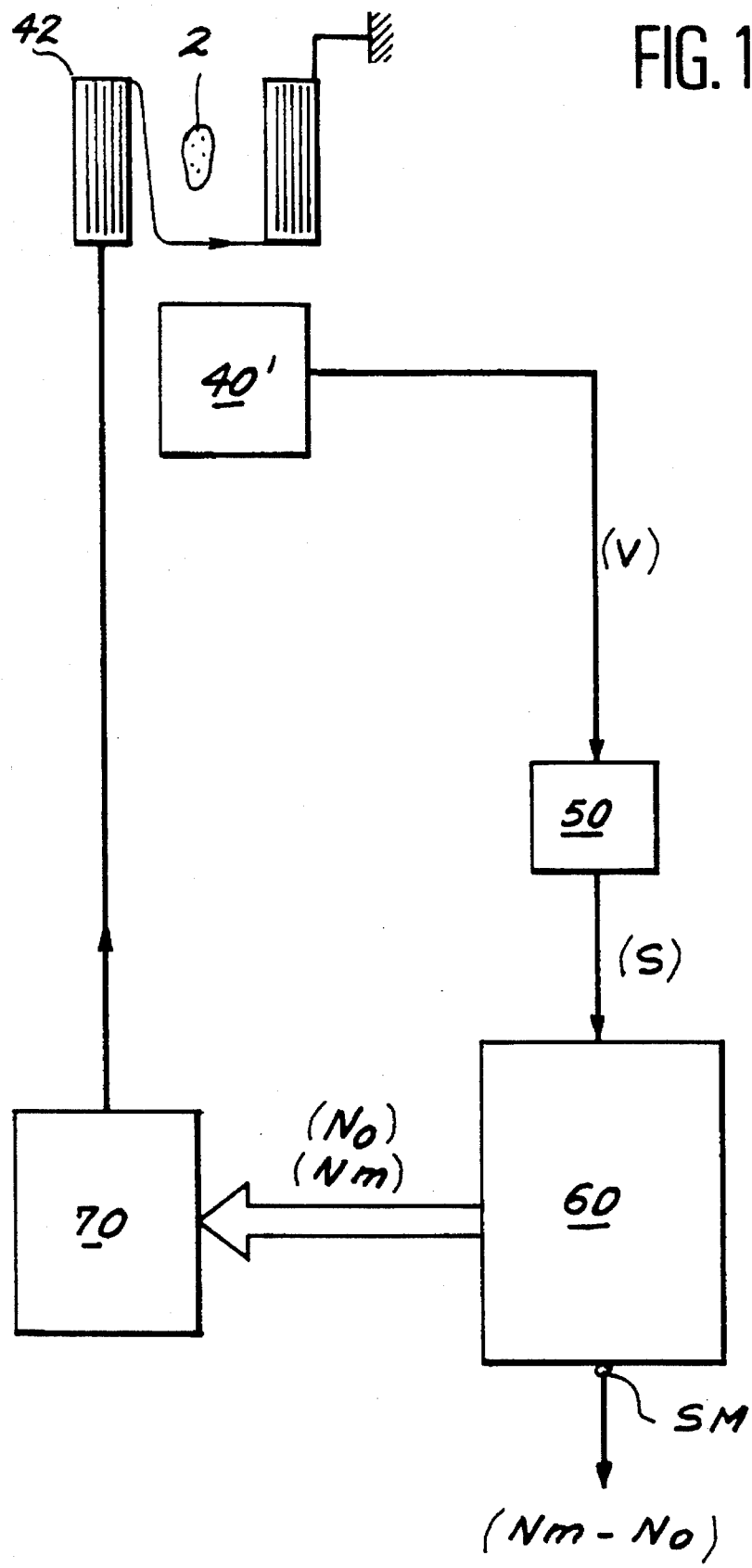
FIG. 11 illustrates another embodiment with digital calibration.

In the variant of FIG. 11, the digital means not only fulfil the measurement function, but also the prior calibration function. For this purpose, when the field to be measured Hm is absent, the processor supplies a number N of value No corresponding to resonance. The field applied is then Nobo+$\epsilon$ (in which $\epsilon$ is once again an error turn increased by bo). In the presence of a field to be measured Hm, the processor reestablishes resonance by forming a number Nm different from No and able to create a feedback field of value (Nm−No)bo, which will oppose the component of the field to be measured in the direction D. The digital value of the field will be given by (Nm−No). The latter appears on the measurement output SM of the processor 60. The error is then below 2bo.

This embodiment suffers from the disadvantage of requiring a number No much higher than Nm (because the polarization field in this type of apparatus and as has already been stressed well above the field to be measured). It is then necessary to use a high dynamics converter 70. For a value of the field to be measured of 100 μT and a value of the polarization field of 1 mT as the maximum converter excursion 1.1 mT is obtained, which gives a minimum resolution for a 16 bit converter of:

$$bo=1.1/2^{16}=17 \ nT \ (approx.)$$

or for a 20 bit converter approx. 1 nT.

Unfortunately this resolution exceeds the resolution which can be achieved with a directional resonance magnetometer. Thus, use will advantageously be made of variants having several converters, as will be described hereinafter.

A second disadvantage of the embodiment of FIG. 11 is linked with the prior calibration performed in digital manner. If bo varies, the measurement can be erroneous. This problem can be solved by performing two successive measurements, one with a polarization field directed in one direction and the other with a field directed in the other direction. At the processor output is then successively obtained two numbers N$^+$m and N$^-$m with the following relations:

$$N^+m \ bo+\epsilon^+=Ho+Hm$$

$$N^-m \ bo+\epsilon^-=Ho-Hm$$

which gives the value of the field to be measured Hm independently of bo:

$$Hm=(N^+m-N^-m)/(N^+m+N^-m)HO+\epsilon'$$

in which $\epsilon'$ is an error term below 2bo.

Any algorithm is suitable for incrementing or decrementing the number N until resonance appears. As non-limitative examples, FIGS. 12 and 13 illustrate algorithms respectively with successive steps and successive approximations and FIG. 14 an algorithm with successive steps and two numbers.

Figure 12A:
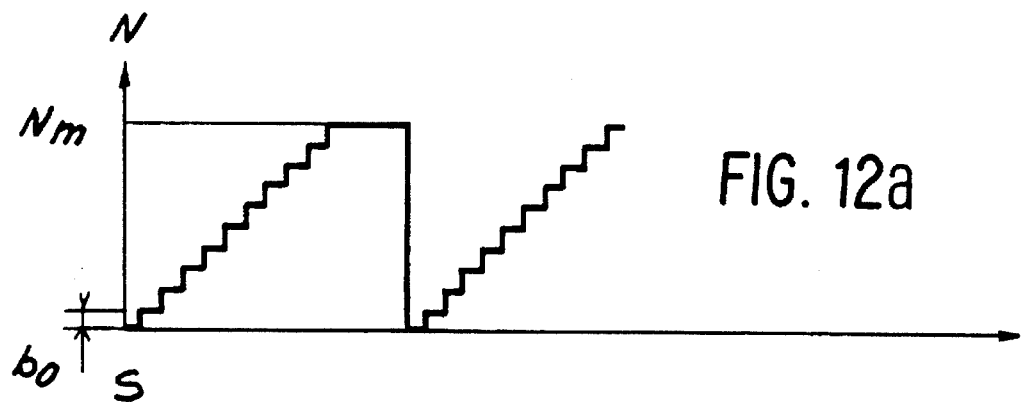
FIG. 12 illustrates an algorithm for forming a number by successive steps.
Figure 12B:
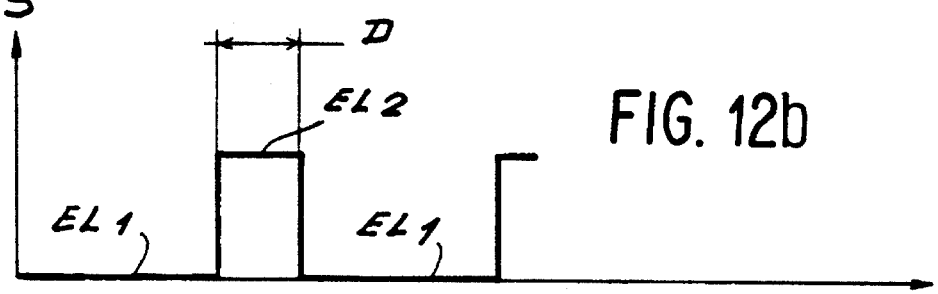

Firstly, in FIG. 12, it is possible to see in part (a), the field H incremented stepwise with an amplitude bo, which corresponds to the least significant bit of the number N. Thus, this number N increases by one unit for each calibration, which is defined by a clock in the processor. During this incrementation, the logic signal S supplied by the logic circuit 50 and shown in part (b) of FIG. 12, remains in its first logic state EL1, in the present case the low state.

However, when the total field reaches the value Ho corresponding to resonance, the signal S switches to its second logic state EL2, in the present case the top state, and the processor blocks the incrementation of the number N. The stop is maintained for a time D so as to permit the storage of the number obtained. The number N is then returned to zero, so that the logic circuit 50 is reswitched to the state EL1 and incrementation resumes.

Figure 13:
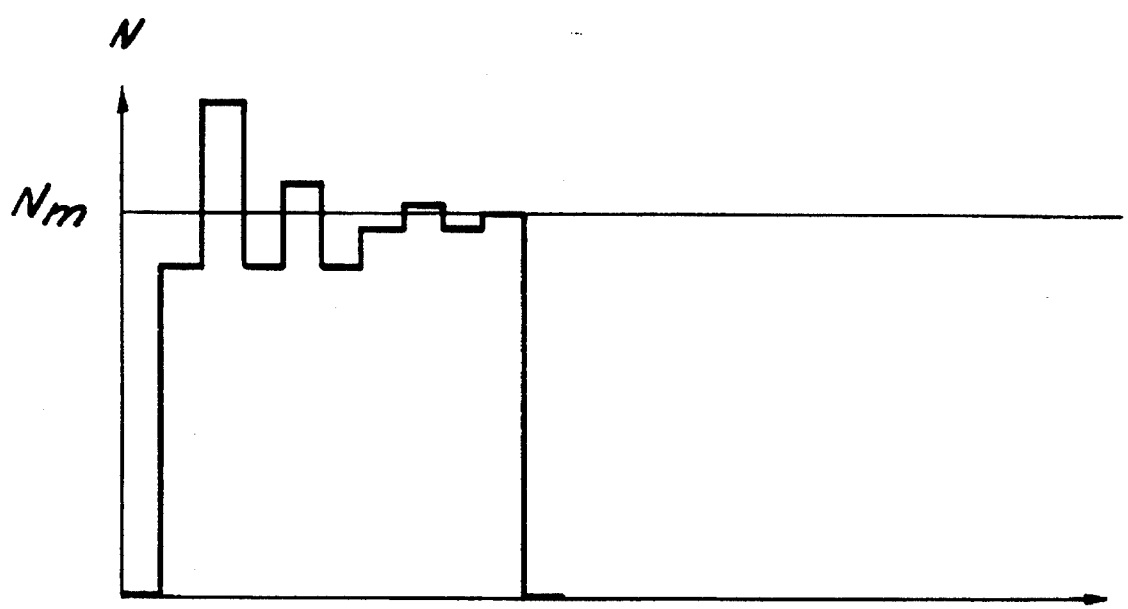
FIG. 13 illustrates an algorithm for forming a number by successive approximations.

FIG. 13 diagrammatically illustrates an algorithm by successive approximations, which makes it possible to more rapidly obtain the sought value. Instead of firstly acting on the least significant bit of N, as in the variant of FIG. 12, action takes place on the most significant bit and the signal S is tested. If the latter has passed to its second logic state EL2, indicating that resonance has been cleared, the most significant bit is returned to zero, if not it is left at 1 and the following lower significant bit is switched from 0 to 1. If the signal S indicates that the resonance has already been passed, the second bit is returned to 0, if not it is left at 1. The procedure continues up to the least significant bit.

In the case illustrated in FIG. 1, the most significant bit has not in itself made it possible to obtain resonance, but the following bit has made it possible to pass beyond it. There has consequently been a restoration to 0. In the same way for the third bit (in decreasing significance order), whereas the fourth bit has been maintained at 1, the fifth has been returned to 0 and so on.

As in the case of FIG. 12, when the value corresponding to resonance is reached, the value of N obtained is stored and displayed on the processor output. The number N is returned to 0.

Figure 14A:
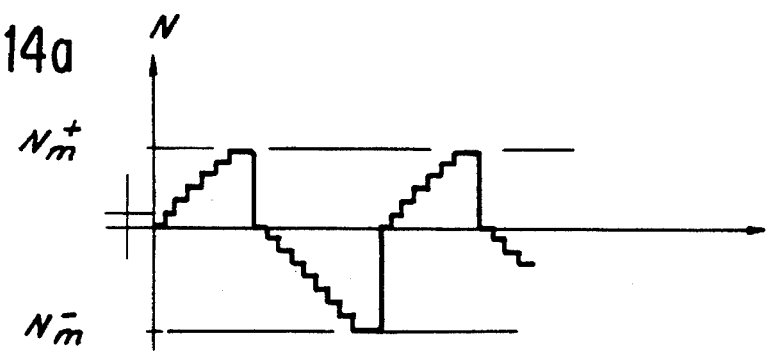
FIG. 14 illustrates an algorithm with two successive numbers, which are respectively positive and negative.
Figure 14B:
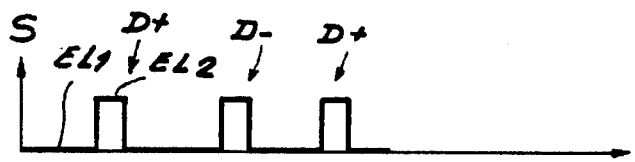

On working with two successive numbers with opposite signs, as explained hereinbefore, in order to eliminate the prior calibration on bo, it is possible to use the preceding algorithms (FIGS. 12 and 13) or any other. For example, FIG. 14 shows how it is possible to seek the two numbers $N^+m$ and $N^-m$ by successive approximations, firstly for the positive number $N^+$ and then for the negative $N^-$(part (a)). Part (b) shows the configuration of the logic signal and the storage periods $D^+$ and $D^-$ of the positive and negative numbers obtained.

Figure 15:
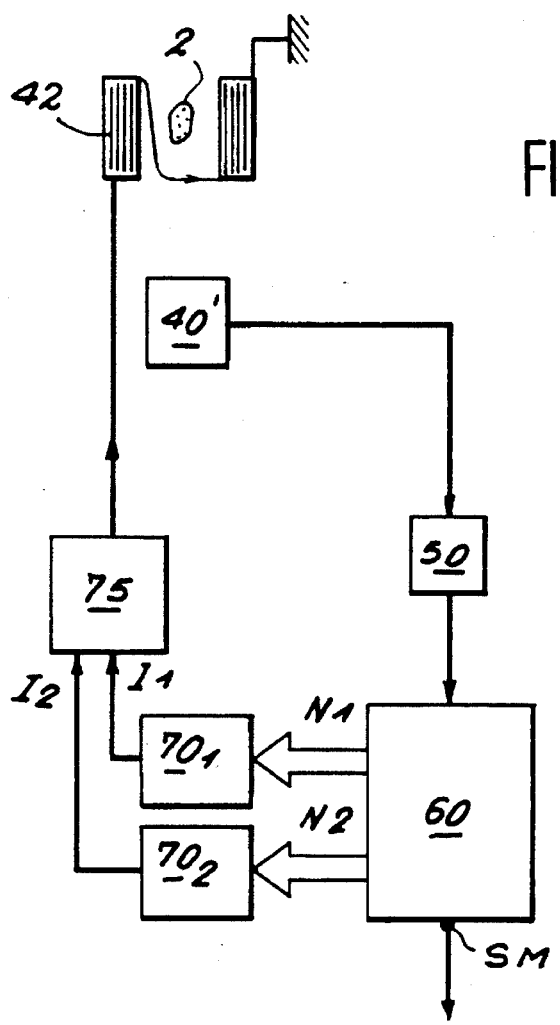
FIG. 15 illustrates an embodiment with two numbers and two digital-analog converters and a current adder.
Figure 16:
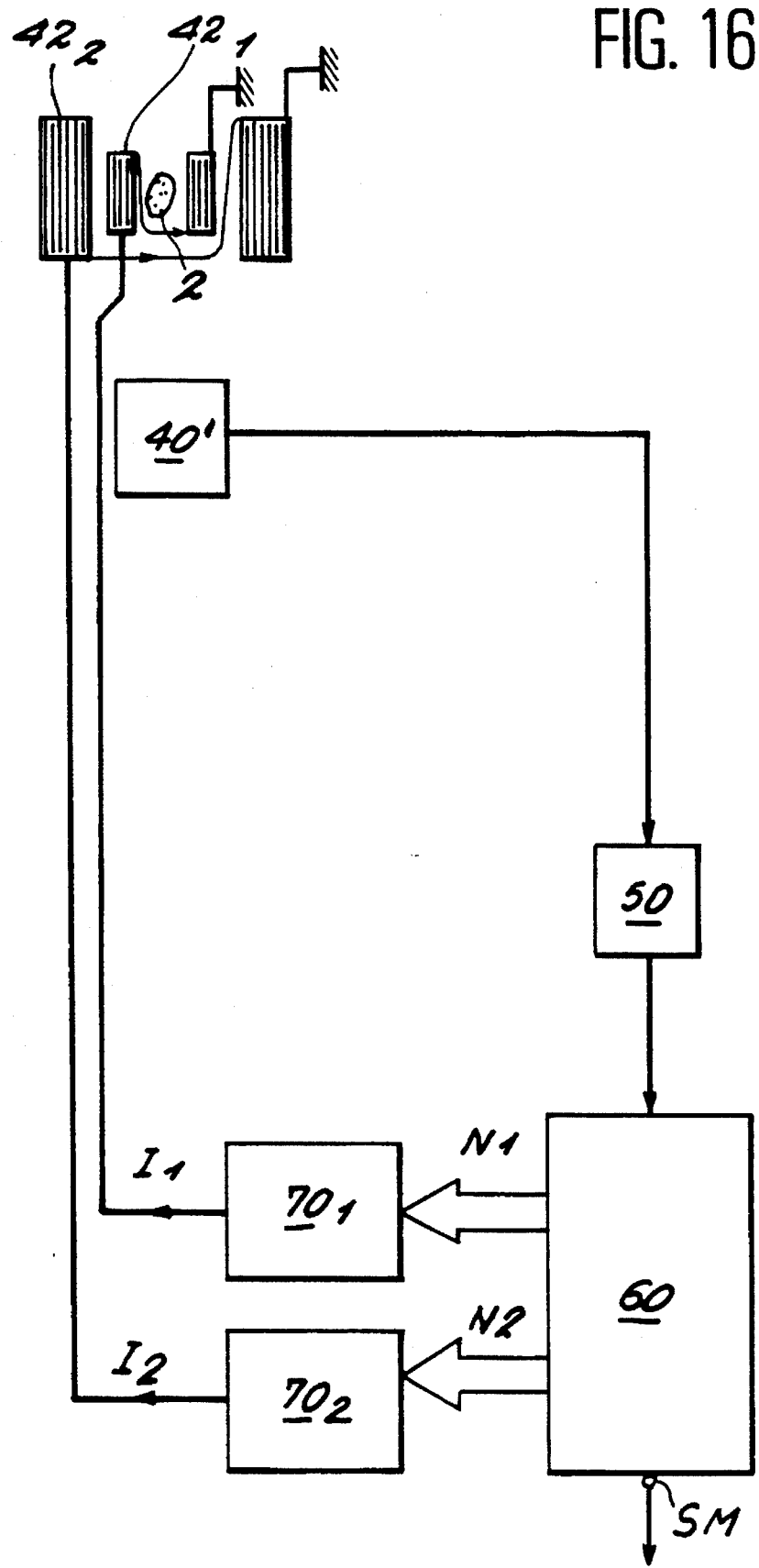
FIG. 16 illustrates another embodiment with two numbers and two digital-analog converters, but with two specific windings.

In the variants described hereinbefore, use is made of a single digital-analog converter. In a more complex variant, it is possible to use two converters of different significances. This is shown in FIGS. 15 and 16, where the two converters carry the references $70_1$ and $70_2$ and respectively supply the currents $I_1$ and $I_2$. The difference between the two illustrated embodiments is that in the first case (FIG. 15), the two currents $I_1$ and $I_2$ are added to one another in an adder 75, the resulting sum being applied to a single winding 42, whereas in the second case (FIG. 16), each current $I_1$, $I_2$ supplies a specific winding respectively $42_1$, $42_2$.

Figures 17A, 17B:
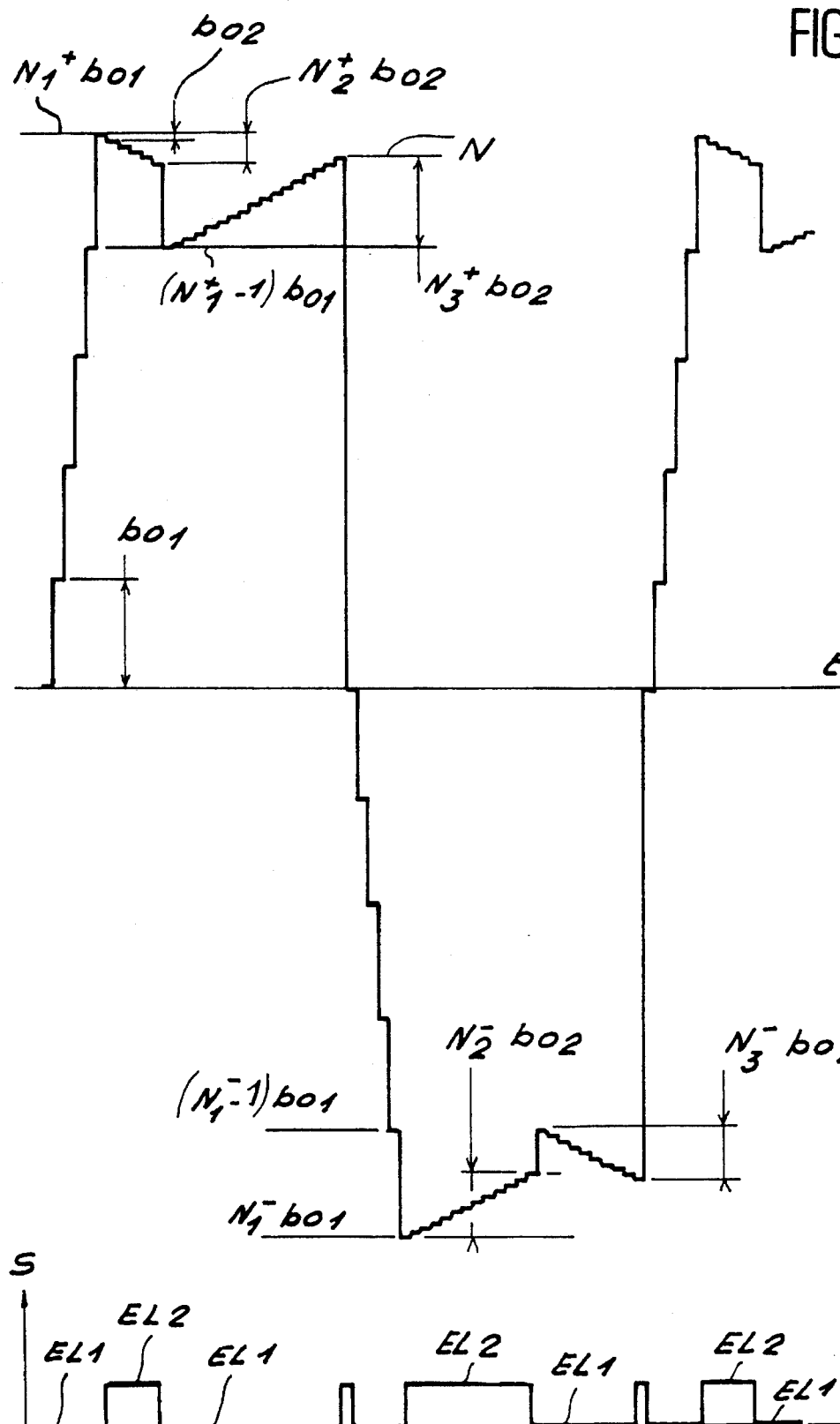
FIG. 17 illustrates an operating algorithm with two numbers.

A particular algorithm applicable for variants using two converters of different significances is illustrated in FIG. 17. The second converter $70_2$ is assumed to have a unit bo2, such that bo2 exceeds bo 1/Nm2. This variant permits an absolute measurement of the field with a resolution equal to (Ho+Hmmax)/2(Nmax1+Nmax2), in which Hmmax is the maximum amplitude of the field to be measured and Nmax1 and Nmax2 are the maximum values of the numbers N1 and N2 applied to the two converters. The sequence of operations is as follows:

1) incrementation of the most significant converter $70_1$ in the positive direction to beyond resonance; measurement of $N_1^+$ and maintenance of this value;
2) incrementation of the least significant converter $70_2$ in the negative direction (i.e. decrementation) to beyond resonance; measurement of $N_2^+$.
3) positioning of the first converter $70_1$ to $N_1^+-1$;
4) incrementation of the least significant converter $70_2$ in the positive direction to beyond resonance; measurement of $N_2^+$.

From the numbers obtained in this way are acquired the relations:

$$Ho+Hm=N_1+bo1-N_2+bo2=(N_1^+1)bo1+N_3+bo2 \qquad (1)$$

$$(N_3^+ +N_2^+ -1)bo2=bo1 \qquad (2)$$

The relation (2) makes it possible to link bo1 to bo2. The error terms have not been written but are increased by bo2.

An identical sequence in the negative direction makes it possible to obtain:

$$Ho-Hm=N_1^-bo1-N_2^-bo2=(N_1^- -1)\,bo1+N_3^-bo2 \qquad (3)$$

$$(N_3^- +N_2^- -1)bo2=bo1 \qquad (4)$$

This makes it possible to calculate Hm:

$$Hm=\frac{(N_1^+ - N_1^-)(N_3^+ + N_2^+ + N_3^- + N_2^- - 2) - 2(N_2^+ - N_2^-)}{(N_1^+ + N_1^-)(N_3^+ + N_2^+ + N_3^- + N_2^- - 2) - 2(N_2^+ + N_2^-)}$$

using a mean value of 2 and 4 for minimizing the error on the relation between bo1 and bo2.

Other algorithms or other variants can be used. They can be deduced from known digital-analog conversion algorithms.

Figure 18:
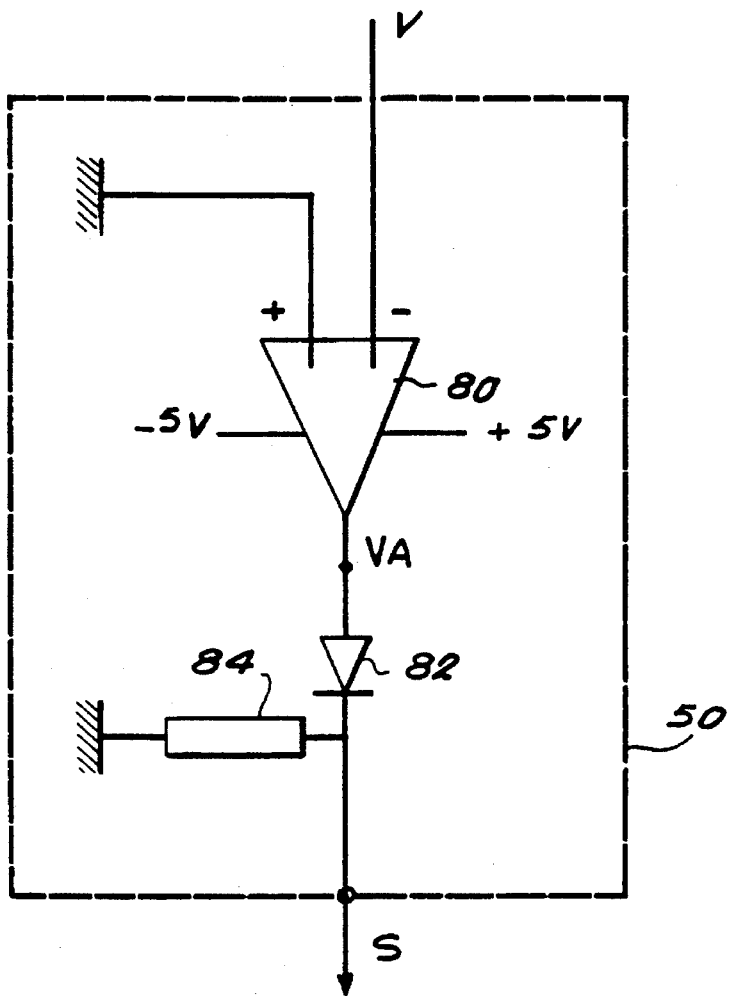
FIG. 18 shows an example of a logic circuit usable in the invention.

With regards to the logic circuit 50 for producing the logic signal S, the expert could easily design its structure. For example, FIG. 18 shows a possible embodiment of this circuit. It is a circuit incorporating a comparator-inverter 80 supplied with ±5 volt and such that its output voltage is −5 V, when its input voltage is slightly positive and equal to ±5 V when its input voltage is slightly negative. This comparator is followed by a diode 82 charged by a resistor 84, the assembly making it possible to only retain the positive value of the output voltage of the comparator.

Figure 5:
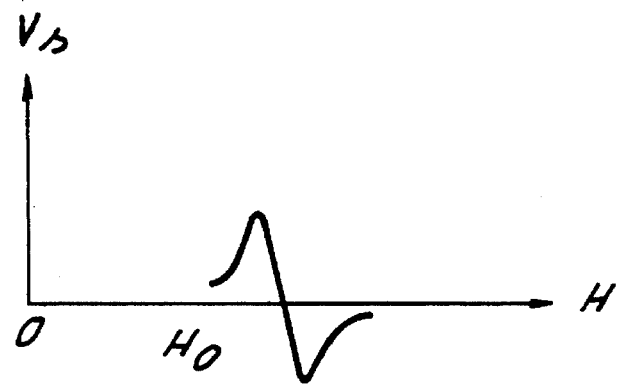
FIG. 5 illustrates the dispersion curve obtained with a magnetometer of the latter type.
Figure 19A:
FIG. 19 is a diagram explaining the operation of the logic circuit of FIG. 18.
Figure 19B:
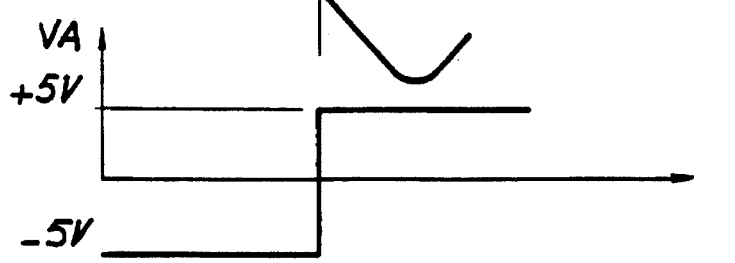
Figure 19C:
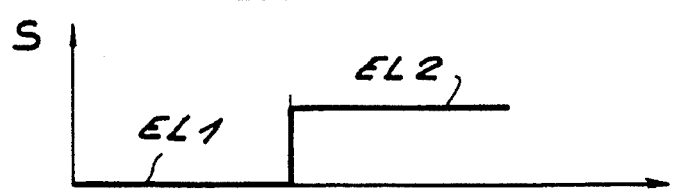

The voltages appearing at different points of the circuit are shown in FIG. 19, (a) representing the input voltage V (which is the antisymmetrical voltage supplied by the means 40, cf. FIGS. 3 and 5), in (b) the voltage VA at point A at the output of the comparator-inverter 80 and in (c) the logic signal S supplied by the circuit 50.

I claim:

1. Digital directional resonance magnetometer comprising:
   a sample with spins (2) immersed in a magnetic field to be measured (Hm),
   first means (4, 6, 8) for exciting the resonance of the spins in the sample (2),
   second means (4, 8) for detecting said resonance,
   third means (16, 18, 20, 26, 28) for supplying a signal (V1, Vs), which is zero when the field applied to the sample (2) has a value (Ho) corresponding to resonance and which is positive or negative when the applied field (H) differs from said value (Ho),
   fourth means able to create a feedback field reestablishing the value (Ho) of the field (H) corresponding to resonance, said magnetometer being characterized in that the fourth feedback means are at least partly digital and comprise:
   a logic unit (50) receiving said signal (V1, Vs) supplied by said third means, said logic unit supplying a logic signal (S) which passes from a first logic state (EL1) to a second logic state (EL2) when said signal (V1, Vs) passes through zero,
   a digital processor (60) having an input connected to said logic unit (50) and an output supplying at least one binary number (N), the processor (60) blocking the number which it supplies when the logic signal (S) which it receives from the logic unit (50) assumes its second logic state (EL2),
   at least one digital-analog converter (70, 70₁, 70₂) receiving the said number (N) supplied by the digital processor (60) and supplying an electric signal (I1) proportional to said number, said signal being used for forming the feedback field, the processor (60) having a measurement output (SM) supplying the value (Nm) of the number (N) corresponding to resonance, said value (Nm) constituting the digital measurement of the field (Hm) applied to the sample (2).

2. Magnetometer according to claim 1, characterized in that the means for forming the feedback field also comprise the digital-analog converter (70) receiving the number (N) supplied by the processor (60) and supplying a first current (I1) proportional to said number and a reference current source (5) corresponding to resonance in the absence of a field to be measured and supplying a second current (Iref).

3. Magnetometer according to claim 2, characterized in that said means for forming the feedback field also comprise a current adder (76) receiving the first and the second currents (Io, Iref), said adder being connected to a winding (3, 42).

4. Magnetometer according to claim 2, characterized in that the digital-analog converter (70) is a current digital-analog converter.

5. Magnetometer according to claim 2, characterized in that the digital-analog converter (70) is a voltage digital-analog converter followed by a voltage-current converter.

6. Magnetometer according to claim 2, characterized in that the digital-analog converter (70) is connected to a specific winding and the current source (5) to another winding (3) with the same axis.

7. Magnetometer according to claim 1, characterized in that the processor (60) supplies two numbers (N1) and (N2) of different significances and in that the means for forming the feedback field comprise a first digital-analog converter (70₁) receiving the first number (N1) and supplying a first current (I1) and a second digital-analog converter (70₂) receiving the second number (N2) and supplying a second current (I2).

8. Magnetometer according to claim 7, characterized in that it comprises an adder (75) receiving the first and second currents (I1, I2) and supplying a single winding.

9. Magnetometer according to claim 7, characterized in that the first digital-analog converter (70₁) is connected to a first winding and the second digital-analog converter (70₂) to a second winding (44₂).

10. Magnetometer according to claim 1, characterized in that the processor (60) is able to increment the number (N) by successive steps.

11. Magnetometer according to claim 1, characterized in that the processor (60) is able to vary the number (N) by successive approximations.

12. Magnetometer according to claim 1, characterized in that it also has dither means (21, 24) able to create a dither field.

13. Magnetometer according to claim 1, characterized in that the feedback means are also able to create a polarization field.

14. Magnetometer according to claim 7, characterized in that it comprises means for:
    A) performing a first sequence of operations in a positive direction, said sequence consisting of the following operations:
       incrementing the first, most significant converter (70₁) in the positive direction to beyond resonance,
       measuring the number ($N_1$) and maintaining said value ($N_1^+$),
       incrementing the least significant converter (70₂) in the negative direction to beyond resonance,
       measuring the number ($N_2$) and maintaining said value ($N_2^+$),
       positioning the first converter (70₁) at $N_1^+ - 1$,
       measuring the value of ($N_2$) ($N_2^+$),
    B) reiterating this sequence of operations, but in the negative direction and obtaining values ($N_1^-, N_2^-$);
    C) calculating the field (Hm) on the basis of the values ($N_1^+, N_2^+, N_1^-, N_2^-$).

* * * * *